US011799287B2

(12) United States Patent
Sivakumar et al.

(10) Patent No.: US 11,799,287 B2
(45) Date of Patent: Oct. 24, 2023

(54) AREA EFFICIENT LEVEL TRANSLATING TRIGGER CIRCUIT FOR ELECTROSTATIC DISCHARGE EVENTS (71) Applicant: QUALCOMM Incorporated, San Diego, CA (US)

(72) Inventors: Ramkumar Sivakumar, San Diego, CA (US); Subbarao Surendra Chakkirala, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 103 days.

(21) Appl. No.: 17/522,729

(22) Filed: Nov. 9, 2021

(65) Prior Publication Data

US 2023/0148160 A1    May 11, 2023

(51) Int. Cl.
*H02H 9/04* (2006.01)
*H02H 1/00* (2006.01)

(52) U.S. Cl.
CPC .......... *H02H 9/046* (2013.01); *H02H 1/0007* (2013.01)

(58) Field of Classification Search
CPC .............................. H02H 9/046; H02H 1/0007
USPC ............................................................ 361/56
See application file for complete search history.

(56) References Cited

U.S. PATENT DOCUMENTS

| | | | |
|---|---|---|---|
| 7,072,161 B2 | 7/2006 | Chen | |
| 7,782,580 B2 | 8/2010 | Gauthier, Jr. et al. | |
| 8,514,532 B2 | 8/2013 | Worley et al. | |
| 8,913,359 B2 | 12/2014 | Lai et al. | |
| 9,640,988 B2 | 5/2017 | Ellis-Monaghan et al. | |
| 9,893,517 B2 | 2/2018 | Dey et al. | |
| 10,116,297 B1 | 10/2018 | Wu | |
| 10,826,291 B2 | 11/2020 | Xavier | |
| 2006/0072267 A1 | 4/2006 | Chatty et al. | |
| 2008/0013233 A1 | 1/2008 | Otake et al. | |
| 2010/0148797 A1 | 6/2010 | Ker et al. | |
| 2010/0246076 A1 | 9/2010 | Campi, Jr. et al. | |
| 2012/0176710 A1 | 7/2012 | Domanski et al. | |
| 2012/0188016 A1 | 7/2012 | Hunt | |
| 2013/0084799 A1 | 4/2013 | Marholev et al. | |
| 2013/0229736 A1 | 9/2013 | Van Der Borght et al. | |
| 2013/0335870 A1* | 12/2013 | Kushibe ................. H02H 9/046 361/56 |
| 2014/0084962 A1 | 3/2014 | Schuler | |
| 2015/0070806 A1* | 3/2015 | Parthasarathy .......... H02H 9/04 361/57 |
| 2015/0229126 A1 | 8/2015 | Domanski et al. | |
| 2015/0288173 A1 | 10/2015 | Chen et al. | |

(Continued)

OTHER PUBLICATIONS

International Search Report and Written Opinion—PCT/US2022/045921—ISA/EPO—dated Feb. 2, 2023.

*Primary Examiner* — Dharti H Patel (74) *Attorney, Agent, or Firm* — Loza & Loza, LLP (57) ABSTRACT A trigger circuit includes a first capacitor and a second capacitor connected in series, a control device and an output of the trigger circuit. The first capacitor is connected to a first voltage rail and to a common node. The second capacitor is connected to a second voltage rail and to the common node. The control device has a first terminal that is coupled to the common node and a control terminal to receive a control signal. The control signal may be decoupled from transients on the first voltage rail and the second voltage rail. The output of the trigger circuit is coupled to the common node.

24 Claims, 7 Drawing Sheets

(56) References Cited

U.S. PATENT DOCUMENTS

| | | |
|---|---|---|
| 2016/0307886 A1 | 10/2016 | Roberts et al. |
| 2016/0372466 A1 | 12/2016 | Weis et al. |
| 2017/0264288 A1 | 9/2017 | Wu |
| 2017/0366083 A1 | 12/2017 | Emsenhuber |
| 2019/0115829 A1* | 4/2019 | Oporta .................... H02J 7/02 |
| 2019/0140635 A1 | 5/2019 | Abesingha et al. |
| 2020/0058603 A1* | 2/2020 | Ahn ....................... H02H 9/046 |
| 2021/0083572 A1* | 3/2021 | Yen ......................... H02J 7/06 |

\* cited by examiner

```
       ┌─────────────────┐
       │ ESD Protection  │
       │     Trigger     │
       └─────────────────┘
                │
                ▼                                    ╭─ 702
┌───────────────────────────────────────────────┐
│ Configure a capacitor divider circuit to      │
│ divide a voltage difference between a first   │
│ voltage rail and a second voltage rail, the   │
│ capacitor divider circuit including first     │
│ capacitor and a second capacitor connected    │
│ in series at a common node, wherein the       │
│ first capacitor is connected to the first     │
│ voltage rail, and wherein the second          │
│ capacitor is connected to the second voltage  │
│ rail                                          │
└───────────────────────────────────────────────┘
                │
                ▼                                    ╭─ 704
┌───────────────────────────────────────────────┐
│ Configure a control device to discharge the   │
│ common node, the control device having a      │
│ first terminal that is coupled to the common  │
│ node and a control terminal configured to     │
│ receive a control signal, the control signal  │
│ being decoupled from transients on the first  │
│ voltage rail and the second voltage rail      │
└───────────────────────────────────────────────┘
                │
                ▼                                    ╭─ 706
┌───────────────────────────────────────────────┐
│ Couple a trigger output to the common node    │
└───────────────────────────────────────────────┘
```

*FIG. 7*

AREA EFFICIENT LEVEL TRANSLATING TRIGGER CIRCUIT FOR ELECTROSTATIC DISCHARGE EVENTS

TECHNICAL FIELD

The present disclosure generally relates to interface circuits for integrated circuits and, more particularly, to circuits that can enhance electrostatic discharge protection in in integrated circuit devices.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Continuous service enhancements require the advancement of process technologies that can provide integrated circuit (IC) devices with ever increasing performance and transistor densities.

Advancements in process technologies tend to reduce transistor gate length and other feature sizes with IC devices. Reductions in gate length and feature sizes can increase the susceptibility of IC devices to electrostatic discharge (ESD) events. IC devices often include ESD protection circuits that can protect interface circuits during different types of ESD events. IC devices may be tested to ensure that they meet minimum industry standards regarding ESD protection. IC device qualification processes may include testing the susceptibility of the IC device to ESD events based on a human-body model (HBM) or based on a charged-device model (CDM) characterization of ESD events. Some ESD protection circuits are based on or evaluated using an HBM or a CDM. The HBM is intended to characterize the susceptibility of devices to damage from ESD events of ±1 kVolt resulting from human touching of an electronic device. The CDM is intended to characterize the susceptibility of devices to damage from ESD events of ±250 Volts that relate to sudden discharges of energy accumulated in an IC chip or package through direct contact charging or field-induced charging.

Changes in certain aspects of large scale IC designs and semiconductor manufacturing processes, including reductions in process minimum feature size can create new or different susceptibilities of IC devices to ESD events. Accordingly, there is an ongoing need for improvements in ESD protection for IC interface circuits.

SUMMARY

Certain aspects of the disclosure relate to systems, apparatus, methods and techniques that can provide enhanced ESD protection in IC devices. Some examples disclosed herein are applicable to interface circuits in an IC, including in high-speed, low-power synchronous dynamic random access memory. Some examples disclosed herein are applicable to the protection of circuits at the boundary between a low-voltage domain that is used to implement certain core features of the IC device and a higher-voltage domain that is used for device input and output (input/output or I/O).

In one aspect of the disclosure, a trigger circuit includes a first capacitor and a second capacitor connected in series, a control device and an output of the trigger circuit. The first capacitor is connected to a first voltage rail and to a common node. The second capacitor is connected to a second voltage rail and to the common node. The control device has a first terminal that is coupled to the common node and a control terminal to receive a control signal. The control signal may be decoupled from transients on the first voltage rail and the second voltage rail. The output of the trigger circuit is coupled to the common node.

In one aspect of the disclosure, an apparatus includes means for dividing a voltage difference between a first voltage rail and a second voltage rail, the means for dividing the voltage difference including first capacitor and a second capacitor connected in series at a common node, and means for selectively discharging the common node. The first capacitor is connected to the first voltage rail and the second capacitor is connected to the second voltage rail. The means for selectively discharging the common node includes a control device having a first terminal that is coupled to the common node and a control terminal configured to receive a control signal. The control signal may be decoupled from transients on the first voltage rail and the second voltage rail. A trigger output is coupled to the common node.

In one aspect of the disclosure, a method for triggering an electrostatic discharge protection circuit includes configuring a capacitor divider circuit to divide a voltage difference between a first voltage rail and a second voltage rail, the capacitor divider circuit including first capacitor and a second capacitor connected in series at a common node, and configuring a control device to discharge the common node. The first capacitor is connected to the first voltage rail, and the second capacitor is connected to the second voltage rail. The control device has a first terminal that is coupled to the common node and a control terminal configured to receive a control signal. The control signal is decoupled from transients on the first voltage rail and the second voltage rail. A trigger output is coupled to the common node.

In certain examples, the control signal is coupled to a reference voltage configured to turn on the control device when magnitudes of voltages of the first voltage rail and the second voltage rail are at respective nominal values. The control device may include a control transistor. The trigger output may have a voltage determined by a source-drain voltage of the control transistor when the control transistor is turned on.

In certain examples, the control signal is coupled to a reference voltage configured to turn off the control device when magnitude of voltage of the first voltage rail or the second voltage rail exceeds a threshold minimum voltage. In one example, the threshold minimum voltage is exceeded during an ESD event.

In one example, the trigger output has a voltage related to a ratio of capacitance values of the first capacitor and the second capacitor during an ESD event. In one example, the control terminal of the control device is coupled to the control signal through a resistance-capacitance circuit.

In one example, the control device is an nMOS transistor. A source of the nMOS transistor may be coupled through a resistance to the first voltage rail or the second voltage rail. In certain examples, the apparatus is implemented using an IC device. The trigger output may be coupled to a transistor in an output circuit of the IC device. The trigger output may be coupled to a transistor that drives an output circuit of the integrated circuit device.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and operating frequencies. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

In many implementations, an IC device may include and/or distinguish between internal core circuits and peripheral or I/O circuits. The internal core circuits may be included in a section of the IC that may be referred to simply as a "core" that performs certain functions including storing data (memory), managing stored data, performing certain logic functions, processing-specific functions, cryptography, image processing and so on. More than one section of an IC may be defined as a core. In many examples, the devices and/or circuits in a core may be configurable to operate at the highest possible operating frequency enabled by the process technology. In many examples, the operating frequency of circuits in a core may be constrained by a power budget and the operating frequency of some core circuits may be configured to obtain fastest operation within the power budget. Lower power consumption in high speed circuits can be achieved by reducing the operating voltage of the core, and process technologies have been evolving to support ever-lower core operating voltages.

The functions of the peripheral or I/O circuits in an IC include the control and driving of data communication and general purpose I/O (GPIO) signals at higher voltage levels than the voltage level used to operate core devices and circuits. Peripheral and/or I/O circuits may be required to support higher amperage current flows into and out of the IC device. In some examples, operating voltages, currents and operating frequencies are mandated for the peripheral or I/O circuits by industry or proprietary standards. The differences between operating characteristics of the core and the peripheral or I/O circuits may increase with every generation of process technology.

An IC device typically receives power from an external power supply. Examples of external power supplies include batteries, solar cells or solar panels, switching power supplies and other types of power converters. The external power supply may provide power at different voltage levels, where the voltage levels are measured with respect to a ground reference. In one example, the ground reference may be designated to be a zero-volt level. Multiple rails may be provided to carry current to or from the power supply. Each rail provides a low resistance path for current flows and each rail may be implemented using one or more wires, connectors, interconnects, traces on a circuit board or the like. The IC device may be coupled to two or more of the rails and may extend these coupled rails internally using low-impedance interconnects or conductive planes with the IC structure. The internal rails conduct current to the various sections of the IC device at a defined voltage level.

In some examples, the internal rails may be referred to as internal power sources or power sources, although the rails may serve as conduits for external power sources. In some examples, internal power sources may include internal rails that are driven by power conditioning circuits, power conversion circuits or circuits that step or step down voltage levels for use within the IC device.

In some examples, the internal rails may be labeled according to usage. In some examples, the ground reference of an IC device or of a section of an IC device may be labeled Voltage-Source-Source ($V_{ss}$), and non-zero voltage rails may be labeled Voltage-Drain-Drain ($V_{dd}$). In many examples, the IC may provide multiple $V_{dd}$ rails, labeled $V_{dd}1$, $V_{dd}2$, $V_{dd}3$, ... $V_{dd}X$, etc. The ground reference may provide a return path for currents flowing through the IC device.

In some instances, different voltage domains may be identified in an IC device. Each voltage domain may include multiple devices or circuits that receive power at a common voltage level. In one example, a first voltage domain may include devices that are coupled between $V_{ss}$ and $V_{dd}1$, a second voltage domain may include devices that are coupled between $V_{ss}$ and $V_{dd}2$, a third voltage domain may include devices that are coupled between $V_{ss}$ and $V_{dd}3$, and so on. A voltage domain may also be referred to as a power domain. The evolution of process technology and the corresponding evolution of transistor technology has led to decreased gate oxide thickness and lower operating voltages in some types of circuits.

Certain aspects of this disclosure relate to input/out (I/O) circuits in IC devices, including I/O circuits included or controlled by circuits that provide an interface between core circuits and peripherals. Peripherals and core circuits may be implemented using the same or different process technologies and may operate at the same or different voltages. In some examples, an interface may support low-speed, higher-voltage peripherals. In some examples, an interface may support high-speed, lower-voltage peripherals. In some examples, an interface may connect to a communication bus that operates at frequencies and voltages defined by industry standards and that imposes current and power requirements on I/O circuits.

In one example, certain aspects of the disclosure are applicable to I/O circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies. Voltage levels for input/out (I/O) signals may be higher than core or memory voltage levels and stacked transistors may be employed in I/O interface circuits to provide output drivers that can span the difference between core or memory voltage levels and voltage levels of I/O pads.

In some mobile, battery-powered applications, multiple voltage rails may be used to conserve power and reduce heat generation. In one example, an SoC output driver may include a voltage rail shared between the output driver and one or more peripheral devices or circuits, and may include voltage rails used exclusively by core circuits or by peripheral devices or circuits.

Certain design enhancements implemented to support higher operating frequencies while minimizing power consumption and dissipation may increase susceptibility to ESD events. In one example, the reduction in gate oxide thickness reduces the maximum gate-drain, gate-source voltage that can be withstood by the device during an ESD event. In another example, the use of multiple voltage rails or domains for power saving purposes can leave a device susceptible to ESD-generated damage to lower voltage gates when higher voltages are used for interfacing with external devices, and lower voltages are provided to operate core circuits. In the latter example, a stack of low threshold voltage transistors may be used to provide I/O drivers that switch within voltage ranges greater than core voltage ranges.

Electrostatic discharge (ESD) events can generate voltages or currents within an IC device that exceed rated operating parameters, including rated operating voltage. Rated operating voltage may lie within a nominal operating range of voltage levels defined for certain devices, circuits or interface pads. Without adequate protection, circuits can be damaged near interface pads facilitate I/O or other sources or entry points of the ESD events. ESD events may occur due to some combination of grounding failures, handling and accumulation of static charge at a surface or point of contact near the IC device. There is a need for enhancement of ESD protection circuits that can be implemented without compromising high-speed performance aspects of I/O driver circuits and that can mitigate surges produced by different types of ESD events.

Certain aspects of this disclosure are described in relation to a charged-device model (CDM) characterization of ESD events. The CDM relates to an ESD event that occurs when a chip, chip carrier or package that includes an IC device contacts a low impedance electrical path. A sudden discharge of energy can occur if the chip, chip carrier or package is carrying an accumulated electrostatic charge, causing a high-voltage pulse or spike at I/O pads of the IC device. The voltage observable at one or more I/O pads may exceed rated tolerances for transistors in the IC device and can cause breakdown or other damage to transistor gates and other features of the IC device if adequate ESD protection is not provided.

Figure 1:
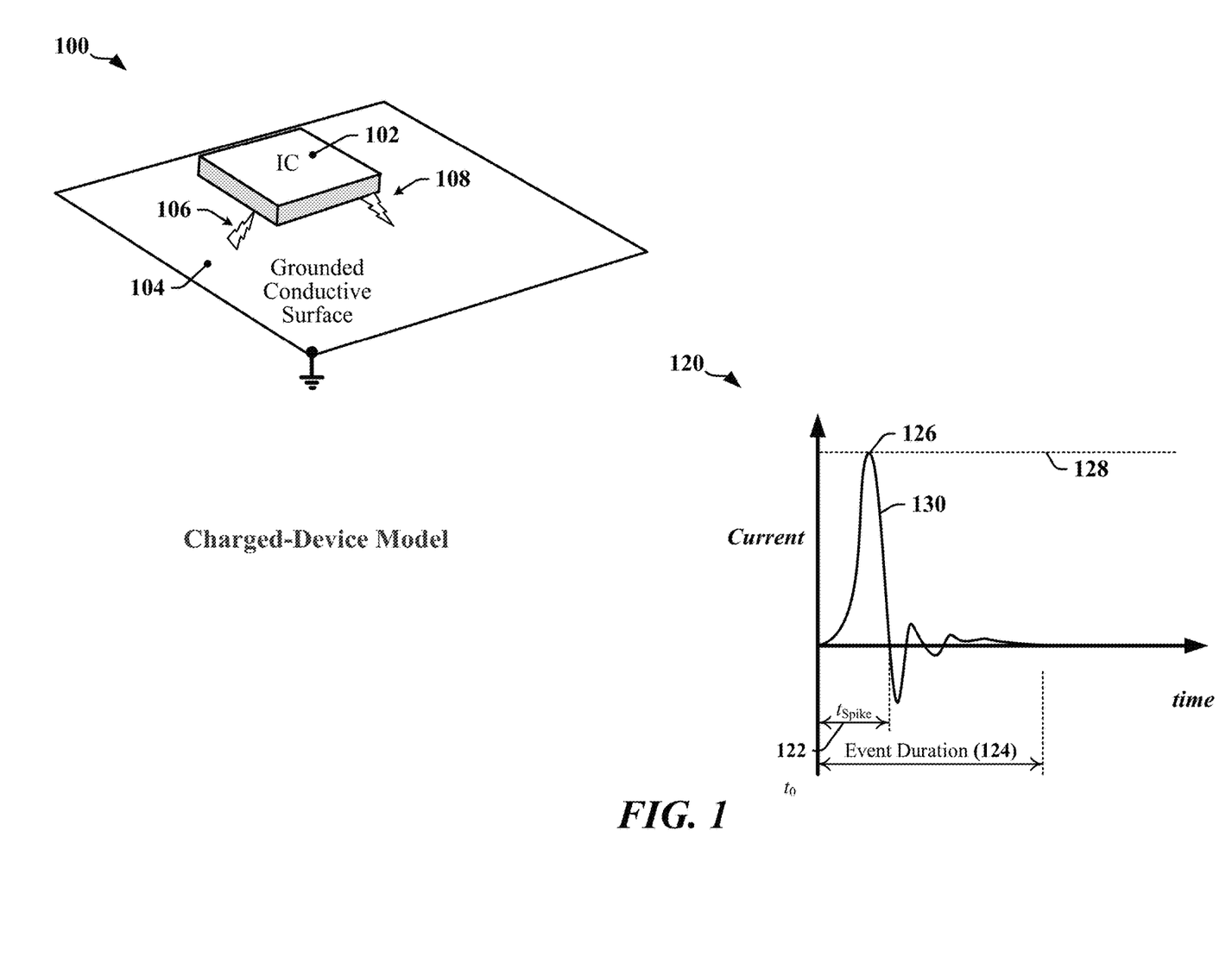
FIG. 1 illustrates an example of ESD event.

FIG. 1 illustrates an example of an ESD event 100 that may be characterized by a CDM. The ESD event 100 occurs as an IC device 102 is placed on a metal or other conductive surface 104. In some examples, this type of ESD event 100 may occur at a manufacturing or assembly facility when IC devices on chips, chip carriers or packages are accumulated, assembled or sorted before being placed and bonded or soldered to a circuit board. In some examples, this type of ESD event 100 may occur at a manufacturing facility when IC devices 102 are picked up by a robot and placed on a circuit board or in a shipment package, where the robot may serve as the conductive surface 104. As the IC device 102 is placed on the conductive surface 104, accumulated charge in the IC device 102 may be discharged to the conductive surface 104 through one or more potential gradients 106, 108. Discharge may occur before or after I/O pins or pads are directly coupled to the conductive surface 104.

The graph 120 illustrates an example of a type of ESD event 100 as characterized by a CDM. In this example, a high percentage of the electrostatic energy accumulated in the IC device 102 is discharged over a short period of time 122 in an initial pulse or spike 130. In one example, the ESD event 100 may have a duration 124 that lasts for approximately 5 nanoseconds with the initial spike 130 ending after approximately 1 nanosecond. In some instances, the discharge may result in a first peak 126 at a current level 128 of 4.7 amps or more. The current spike flowing through an I/O pad of the IC device 102 may cause a correspondent spike in voltage in the interface circuits of the IC device 102.

Current ESD protection schemes employed to protect output drivers typically include diodes connected between an interface pad and output power supply rails and may include a clamping circuit with a discharge path that can carry the ESD current during an ESD event.

Figure 2:
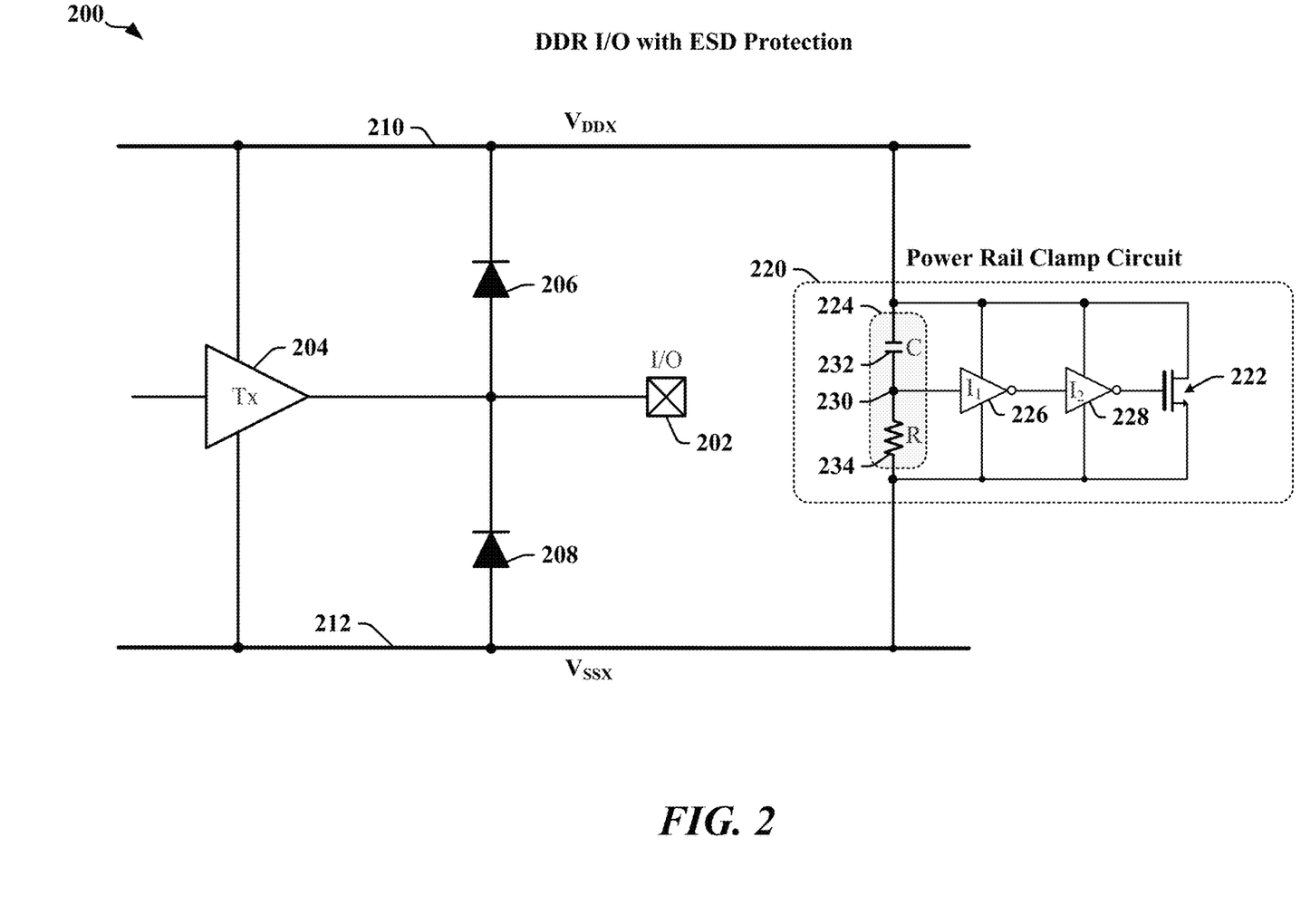
FIG. 2 illustrates an example of an interface circuit that provides ESD protection in an IC device.

FIG. 2 illustrates an example of an interface circuit 200 that provides ESD protection in an IC device. In one example, the interface circuit 200 may be incorporated in an IC, SoC or other device communicatively coupled to an LPDDR SDRAM. The interface circuit 200 includes a driver 204 that can be used to transmit signals through an I/O pad 202 of the IC device. The driver 204 may be configured to provide an output that switches between a power rail ($V_{DDX}$ 210) and a ground reference ($V_{SSX}$ 212). ESD protection is provided by a pair of diodes 206, 208. A first diode 206 is coupled to $V_{DDX}$ 210 and to the I/O pad 202 and is reverse biased when the voltage of the I/O pad 202 remains below $V_{DDX}$ 210. A second diode 208 is coupled to $V_{SSX}$ 212 and to the I/O pad 202 and is reverse biased when the voltage of the I/O pad 202 remains above $V_{SSX}$ 212. An ESD event may cause a current surge that is conducted through the I/O pad 202 and through one or more interconnects coupled to the I/O pad 202, including interconnects that couple the I/O pad 202 and the driver 204. While the interconnects have a low resistance, the voltage of the I/O pad 202 relative to $V_{DDX}$ 210 and/or $V_{SSX}$ 212 and can significantly change when conducting a multi-amp ESD surge current. The change in voltage may be sufficient to forward bias one of the diodes 206, 208, thereby enabling the ESD surge current to be diverted to $V_{DDX}$ 210 or $V_{SSX}$ 212 away from the driver 204 and other circuits of the IC device.

The diversion of the ESD surge current to $V_{DDX}$ 210 or $V_{SSX}$ 212 can increase the voltage difference between $V_{DDX}$ 210 and $V_{SSX}$ 212, which can stress or damage devices in the interface circuit 200 if left unchecked. The illustrated interface circuit 200 includes a power rail clamping circuit 220 that is coupled between $V_{DDX}$ 210 and $V_{SSX}$ 212. The power rail clamping circuit 220 includes an N-type metal-oxide-semiconductor (NMOS or nMOS) transistor 222 that is biased by a serial RC network 224. The RC network 224 has a capacitor 232 coupled in series with a resistor 234. In the illustrated example, the serial RC network 224 is coupled between power supply $V_{DDX}$ 210 and the ground reference $V_{SSX}$ 212. A node 230 coupling the capacitor 232 and the resistor 234 is coupled to the gate of the transistor 222 through a buffer amplifier arrangement including first and second series-connected inverters 226, 228. The power rail clamping circuit 220 ensures a low impedance path from $V_{DDX}$ 210 to $V_{SSX}$ 212 when an ESD pulse applied to the I/O pad 202 causes the voltage difference between $V_{DDX}$ 210 and $V_{SSX}$ 212 to increase.

In one example, a rising voltage on $V_{DDX}$ 210 is coupled through the capacitor 232 to the input of the first inverter 226 forcing its output low. In response, the output of the second inverter 228 goes high turning on the transistor 222. When the transistor 222 turns on, the ESD discharge current can begin to flow between $V_{DDX}$ 210 and $V_{SSX}$ 212.

Figure 3:
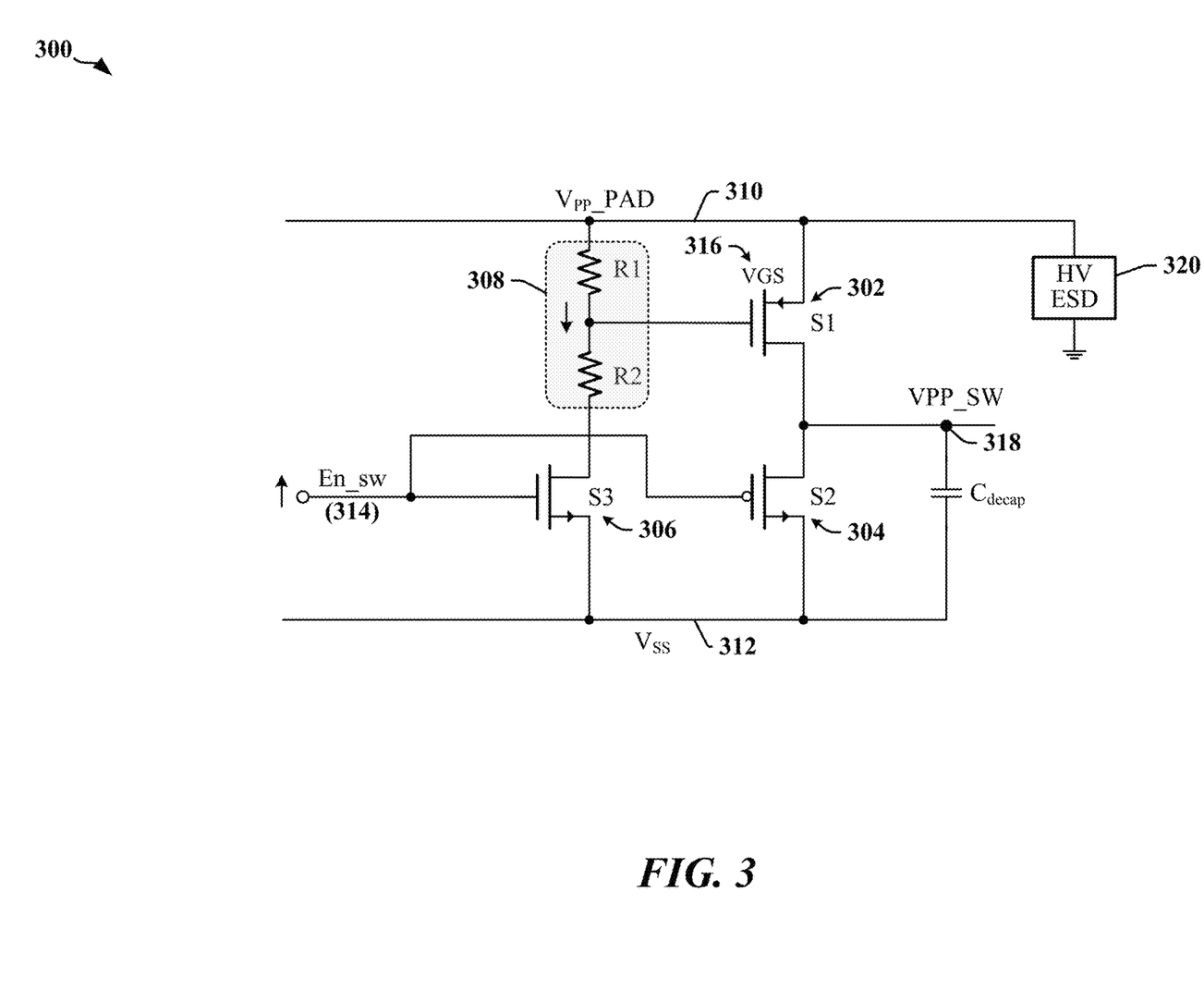
FIG. 3 illustrates an example of a circuit that may be susceptible to damage during an ESD event.

Certain scenarios can occur during an ESD event that can cause the potential across some internal nodes of an IC device to increase, resulting in excessive voltages across junctions of devices that can cause breakdown in some cases. FIG. 3 shows an example of a circuit 300 that may be susceptible to damage during an ESD event represented as a high-voltage ESD current source 320. The ESD event may result in a surge current through an I/O pad of an IC device, causing an ESD protection circuit to be activated in order to shunt the ESD surge current to a supply rail 310 of the IC device. The surge current may be associated with a sudden increase in voltage at the I/O pad and a short-term voltage increase of the supply rail 310 with respect to a ground rail 312 or another supply rail of the IC device. The voltage of the supply rail 310 that receives the shunted surge current may be increased above specified maximum voltages and voltage differences may be increased in individual circuits and devices sufficient to affect the operation of the circuit 300 and cause damage to certain devices in the circuit 300. For example, voltage differences resulting from ESD events at internal nodes of an IC device can cause unintentional potentials to be developed across various junctions of transistors and can cause breakdown of the junctions in some cases.

In the illustrated example, the gate voltage of the S3 transistor 306 follows the supply rail 310 during an ESD event and may rise to a sufficient level that the S3 transistor 306 is turned on. The source of the S1 transistor 302 follows closely the rising voltage of the supply rail 310, while the Gate-Source voltage 316 of the S1 transistor 302 depends on the voltage divider 308 (R1/R2) when the S3 transistor 306 is turned on due to the ESD surge.

In certain instances, the enable signal 314 (En_sw) applied to the S2 transistor 304 and the S3 transistor 306 is provided by a chain of buffer amplifier circuits and may rise unintentionally during an ESD event due to some combination of supply rails coupled to the buffer amplifier circuits and the nature of the ESD event. During an ESD event, the Gate-Source voltage 316 of the S1 transistor 302 can cause reliability issues for the S1 transistor 302, and can cause potentially damaging over-voltage transitions at the VPP_SW node 318. In one example, the voltage applied to the gate of the S3 transistor 306 by the gate enable signal 314 (En_sw) can rise when the voltage of the supply rail 310 increases under the influence of an ESD event. The increase in the voltage of the supply rail 310 may be dependent to some degree on the structure of diodes in the IC device and the Gate-Source voltage 316 of the S1 transistor 302 depends on relative resistances of the resistors in the voltage divider 308. The combined effect of the supply rail 310 (coupled to the source of the S1 transistor 302) and the Gate-Source voltage 316 of the S1 transistor 302 can cause reliability issues for the S1 transistor 302 and can lead to voltage build up on the VPP_SW node 318. Some conventional ESD protection circuits attempt to avoid these reliability issues and potential overvoltage conditions on the VPP_SW node 318 VPP_SW node 318 by using a trigger mechanism to clamp or shutoff circuits or devices.

Figure 4:
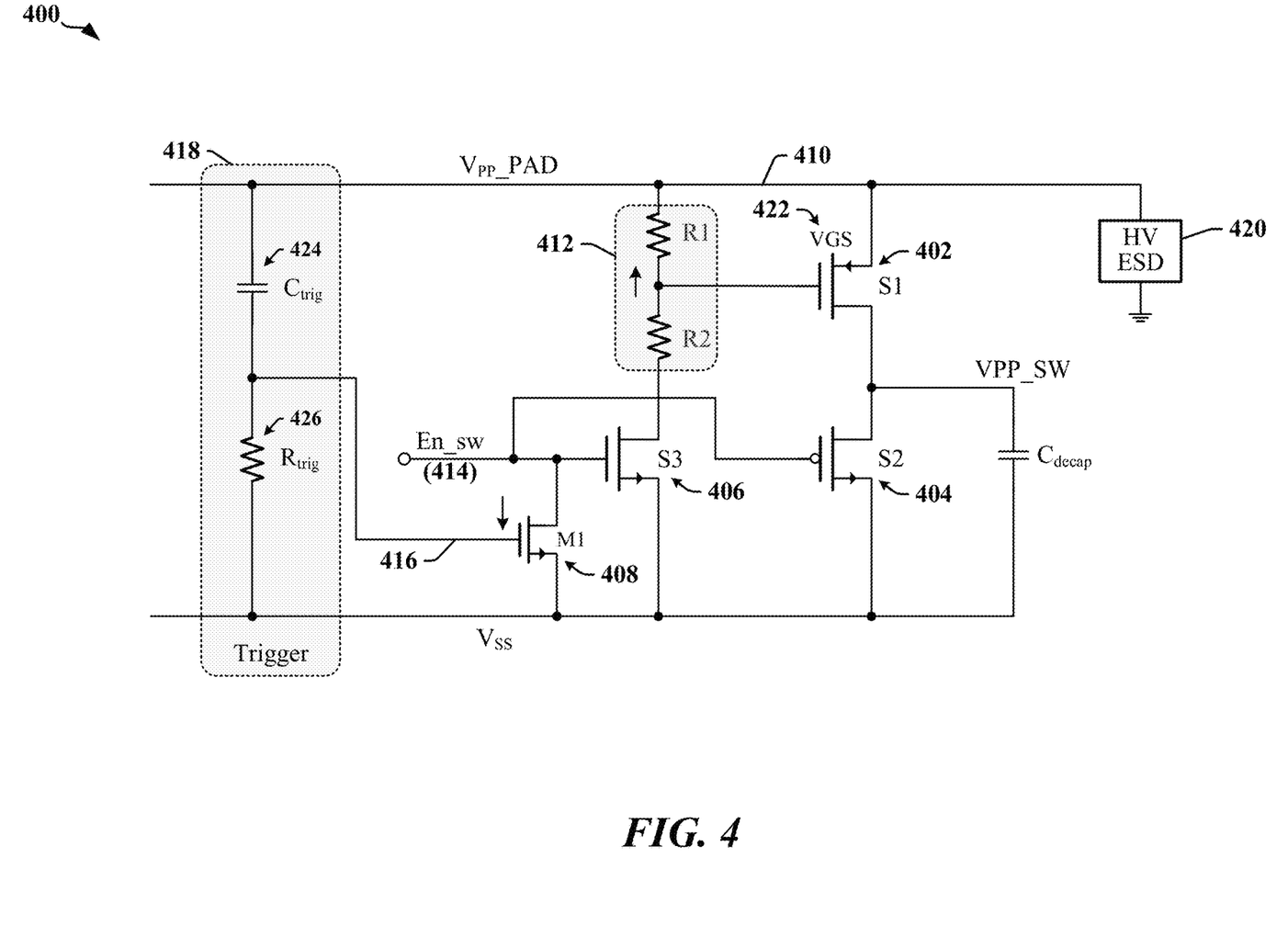
FIG. 4 illustrates the user of a trigger in a circuit that is protected by a shutoff transistor.

Certain ESD protection circuits can activate clamping circuits or shutoff circuits when an ESD event is detected. In some examples, trigger mechanisms may be used to initiate an active mode for an ESD clamp. In some examples, trigger mechanisms may be used to turn off certain transistors during active ESD events in order to protect circuits from surge currents or voltages propagated by variations in supply rails, for example. FIG. 4 illustrates the user of a trigger in a circuit 400 that is protected by a shutoff transistor (the M1 transistor 408). In the illustrated example, the source of the S1 transistor 402 follows closely the rising voltage of the supply rail 410, while the Gate-Source voltage 422 of the S1 transistor 402 depends on the voltage divider 412 (R1/R2) when the S3 transistor 406 is turned on. The circuit 400 includes a trigger mechanism that having a resistance 426 and capacitance 424 in combination (the RC circuit 418) configured to generate a trigger signal 416 coupled to the M1 transistor 408. Other trigger mechanisms may use snapback in a parasitic bipolar junction transistors (BJT). Parasitic BJTs are inherent in many MOSFETs. Snapback turns on a transistor when a collector-to-base current resulting from avalanche breakdown is applied to the base-collector junction during an ESD induced over-voltage.

In the illustrated example, the triggering mechanism is coupled to the M1 transistor 408. The M1 transistor 408 is configured to turn off an S3 transistor 406 during an ESD event represented as a high-voltage ESD current source 420. The ESD event may cause an ESD protection circuit to be activated in order to shunt the ESD surge current to a supply rail 310 of the IC device. The RC circuit 418 applies a fraction of ESD voltage developed on an I/O pad (for example) to the gate input of the M1 transistor 408 through the trigger signal 416, turning on the M1 transistor 408 and turning off (clamping) the S1 transistor 402 and the S2 transistor 404 by pulling down the enable signal 414 coupled to the gates of the S2 transistor 404 and the S3 transistor 406. The voltage at the gate of transistor S1 then tracks the ESD voltage.

The trigger voltage developed by the RC circuit 418 in the conventional system illustrated in FIG. 4 must be sufficiently high to turn on the M1 transistor 408 and sufficiently low to protect the M1 transistor 408 under all expected operating conditions. The RC time constant of the M1 transistor 408 must provide coverage for the entire overvoltage period during ESD events. For example, HBM-type ESD events generally have a duration that last up to several hundred nanoseconds whereas the International Electrotechnical Commission (IEC) 41000 class 4 and 5 ESD events can endure for several microseconds. The IEC 41000 standard classifies ESD events arising from surges on power lines resulting from lightning, the operation of power switches and other sources of surges. A trigger circuit in an ESD protection circuit is generally required to control both the trigger voltage and the time constant of the circuit. A low resistance is desired to ensure that the trigger voltage provided on the trigger signal 416 is less than the rated maximum voltage specified for the of the M1 transistor 408. A low capacitance is desired to provide an impedance that is sufficiently high to achieve voltage division. A low resistance combined with a low capacitance produces a low RC constant and the requirement for the low resistance and low capacitance can result in an inability to scale for ESD events with a range of time constants.

A tight coupling exists between the RC time constant and the maximum voltage allowed for the trigger signal. Furthermore, a large area of an IC device is generally required to implement an RC circuit 418 capable of meeting maximum voltage requirements and of providing a suitable RC constant. Additionally, it can be difficult to accommodate the effects of process, voltage and temperature (PVT) variance on the RC time constant in conventional circuits. In general, the design of a single RC-based trigger mechanism for ESD events with time constants that exhibit orders of magnitude of difference is very challenging and can render RC-based trigger mechanisms impractical.

Certain aspects of this disclosure relate to a trigger mechanism that can reliably respond to different types of ESD events. The trigger mechanism can maintain its trigger voltages within rated maximum voltage ranges over a broad range of time constants.

Figure 5:
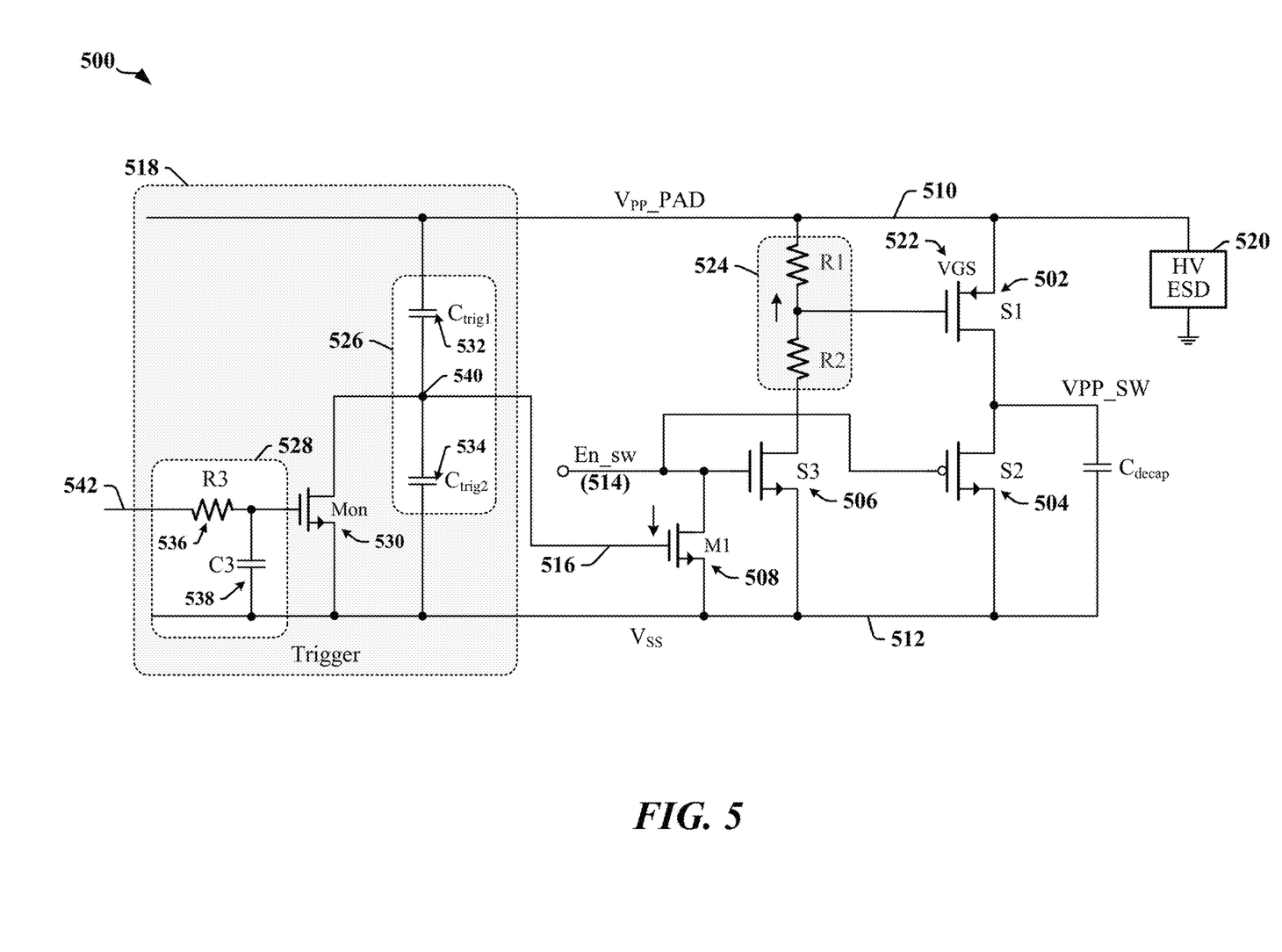
FIG. 5 illustrates a first example of an ESD-protected circuit in an IC device that includes a trigger circuit configured or adapted in accordance with certain aspects of the disclosure.

FIG. 5 shows a first example of an ESD-protected circuit 500 in an IC device that includes a trigger circuit 518 configured or adapted in accordance with certain aspects of the disclosure. In the illustrated example, the source of the S1 transistor 502 follows closely the rising voltage of the supply rail 510, while the Gate-Source voltage 522 of the S1 transistor 502 depends on the voltage divider 524 (R1/R2) when the S3 transistor 506 is turned on. In the illustrated example, the trigger circuit 518 responds to an ESD event (represented as a high-voltage ESD current source 520) by clamping two transistors (the S2 transistor 504 and the S3 transistor 506) to prevent unintended voltage drops across the junctions of transistors in the protected circuit 500 and, in some instances, to protect other parts of the IC device.

The trigger circuit 518 applies a fraction of ESD voltage developed on an I/O pad (for example) to the gate input of the M1 transistor 508 through the trigger signal 514, turning on the M1 transistor 508 and turning off (clamping) the S1 transistor 502 and the S2 transistor 504 by pulling down the enable signal 514 coupled to the gates of the S2 transistor 504 and the S3 transistor 506.

The trigger circuit 518 includes a capacitor divider circuit 526 having series connected capacitors 532, 534 coupled between two voltage rails 510, 512 of the IC device. The trigger signal 516 output by the trigger circuit 518 is provided by the common node 540 to which the series connected capacitors 532, 534 are coupled. The trigger signal 516 is coupled to a shutoff transistor (the M1 transistor 508) that is configured to turn off the S2 transistor 504 and the S3 transistor 506 during an ESD event by pulling the gates of the S2 transistor 504 and the S3 transistor 506 to a second voltage rail, which may be a $V_{ss}$ rail 512.

The voltage of the trigger signal 516 is related to the ratio of capacitance values of the series connected capacitors 532, 534. For instance, in the current example, the voltage ($V_{trigger}$) of the trigger signal 516 can be determined by:

$$V_{trigger} = \left(\frac{C_{trig1}}{C_{trig1} + C_{trig2}}\right) \times V_{PP\_PAD}.$$

The series connected capacitors 532, 534 can have capacitance values that are significantly lower than the capacitance 424 required in the RC circuit 418 (see FIG. 4) used in conventional ESD protection circuits. The capacitors 532, 534 consequently occupy substantially smaller areas on the IC device than the area that would be occupied by the conventional the RC circuit 418.

The capacitor divider circuit 526 provides a trigger signal 516 with a time constant that tracks the time constant of each ESD event affecting a first voltage rail 510 (here, VPP_PAD) through surges introduced at an I/O pad, for example. In accordance with some aspects of this disclosure, the parasitic resistances coupled to the capacitor divider circuit 526 are limited due to the small physical size of the transistors 508, 530 coupled to the capacitor divider circuit 526. The resultant low RC constant associated with the capacitor divider circuit 526 enables the trigger signal 516 to closely follow the ESD-generated surge voltage on the $V_{ss}$ rail 512. The capacitor divider circuit 526 has effectively the same time constant as the surge voltage.

The trigger circuit 518 includes a discharge transistor 530 (the Mon transistor) that is configured to be turned off during ESD events. In normal non-ESD operation, the discharge transistor 530 is turned on and ensures that the voltage at the common node 540 between the series connected capacitors 532, 534 is pulled to the $V_{ss}$ rail 512, turning off the discharge transistor 530. The gate of the discharge transistor 530 is coupled to a control signal 542 generated using, for example, an internal voltage rail of the IC device. The control signal 542 may be decoupled from transients on the first voltage rail 510 and the second voltage rail 512. In some instances, the control signal 542 is coupled to a reference voltage configured to turn on the discharge transistor 530 when magnitudes of voltages of the first voltage rail 510 and the second voltage rail 512 are at respective nominal values.

As the voltages in the protected circuit 500 rise in response to an ESD surge, the discharge transistor 530 is turned off. An RC network 528, including a resistance 536 and a capacitance 538 is coupled to the gate of the discharge transistor 530 and can be configured to mitigate rises in voltage in the control signal 542 during an ESD event. The RC network 528 slows the rise in voltage of the gate of the discharge transistor 530, thereby preventing or minimizing premature discharge of the common node 540 between the series connected capacitors 532, 534. In one example, the RC network 528 is configured based on an expected time constant for ESD discharges.

Figure 6:
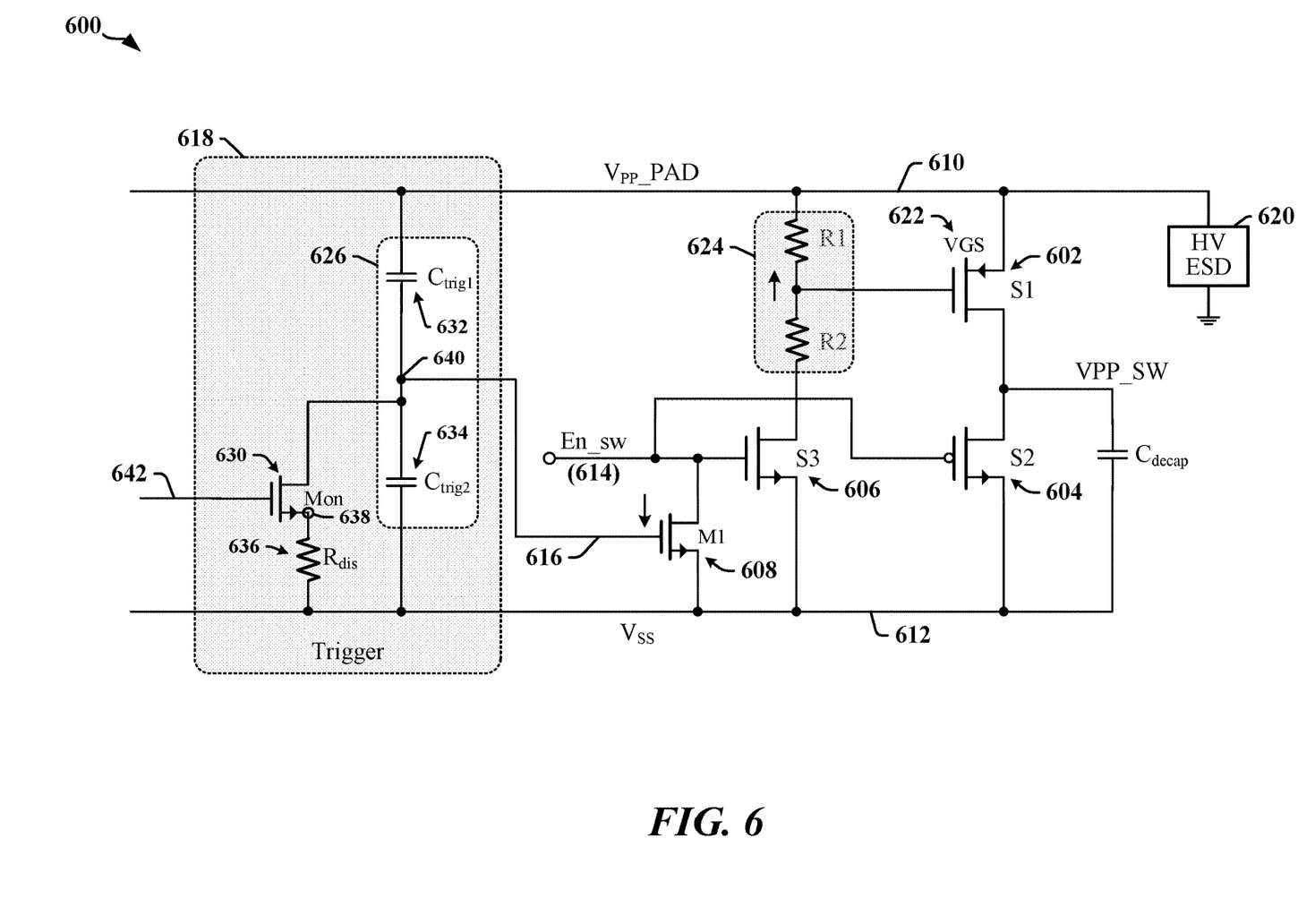
FIG. 6 illustrates a second example of an ESD-protected circuit in an IC device that includes a trigger circuit configured or adapted in accordance with certain aspects of the disclosure.

FIG. 6 shows a second example of an ESD-protected circuit 600 in an IC device that includes a trigger circuit 618 configured or adapted in accordance with certain aspects of the disclosure. In the illustrated example, the source of the S1 transistor 602 follows closely the rising voltage of the supply rail 610, while the Gate-Source voltage 622 of the S1 transistor 602 depends on the voltage divider 624 (R1/R2) when the S3 transistor 606 is turned on. In the illustrated example, the trigger circuit 618 responds to an ESD event (represented as a high-voltage ESD current source 620) by clamping two transistors (the S2 transistor 604 and the S3 transistor 606) to prevent unintended voltage drops across the junctions of transistors in the ESD-protected circuit 600 and, in some instances, in other parts of an IC device.

The trigger circuit 618 applies a fraction of ESD voltage developed on an I/O pad (for example) to the gate input of the M1 transistor 608 through the trigger signal 614, turning on the M1 transistor 608 and turning off (clamping) the S1 transistor 602 and the S2 transistor 604 by pulling down the enable signal 614 coupled to the gates of the S2 transistor 604 and the S3 transistor 606.

The trigger circuit 618 includes a capacitor divider circuit 626 having series connected capacitors 632, 634 coupled between two voltage rails 610, 612 of the IC. The trigger signal 616 output by the trigger circuit 618 is provided by the common node 640 to which the series connected capacitors 632, 634 are coupled. The trigger signal 616 is coupled to a shutoff transistor (the M1 transistor 608) that is configured to turn off the S2 transistor 604 and the S3 transistor 606 during an ESD event by pulling the gates of the S2 transistor 604 and the S3 transistor 606 to a second voltage rail, which may be the $V_{ss}$ rail 612.

The voltage of the trigger signal 616 is related to the ratio of capacitance values of the series connected capacitors 632, 634. For instance, in the current example, the voltage ($V_{trigger}$) of the trigger signal 616 can be determined by:

$$V_{trigger} = \left( \frac{C_{trig1}}{C_{trig1} + C_{trig2}} \right) \times V_{PP\_PAD}.$$

The capacitance values can have capacitance values that are significantly lower than the capacitance 424 required in the RC circuit 418 (see FIG. 4) used in conventional ESD protection circuits. The capacitors 632, 634 consequently occupy substantially smaller areas on the IC device than the area that would be occupied by the conventional the RC circuit 418.

The capacitor divider circuit 626 provides a trigger signal 616 with a time constant that tracks the time constant of each ESD event affecting a first voltage rail 610 (VPP_PAD) through surges introduced at an I/O pad, for example. In accordance with some aspects of this disclosure, the parasitic resistances coupled to the capacitor divider circuit 626 are limited due to the small physical size of the transistors 608, 630 coupled to the capacitor divider circuit 626. The resultant low RC constant associated with the capacitor divider circuit 626 enables the trigger signal 616 to closely follow the ESD-generated surge voltage on the $V_{ss}$ rail 612. The capacitor divider circuit 626 has effectively the same time constant as the surge voltage.

The trigger circuit 618 includes a discharge transistor 630 (the Mon transistor) that is configured to be turned off during ESD events. In normal non-ESD operation, the discharge transistor 630 is turned on and ensures that the voltage at the common node 640 between the series connected capacitors 632, 634 is pulled to the Vss rail 612, turning off the discharge transistor 630. In some examples, the gate of the discharge transistor 630 is coupled to a control signal 642 generated using an internal voltage rail of the IC device. The control signal 642 may be decoupled from transients on the first voltage rail 610 and the second voltage rail 612. In some instances, the control signal 642 is coupled to a reference voltage configured to turn on the discharge transistor 630 when magnitudes of voltages of the first voltage rail 610 and the second voltage rail 612 are at respective nominal values. As the voltages in the ESD-protected circuit 600 rise in response to an ESD surge, the discharge transistor 630 is turned off. A discharge resistor 636 is coupled to the source 638 of the discharge transistor 630 and can be configured to mitigate for rises in voltage in the control signal 642 during an ESD event. The discharge resistor 636 serves as a degeneration resistance that increases the effective discharge resistance observed at the common node 640 of the capacitor divider circuit 626 and slows the rate of discharge of the series connected capacitors 632, 634 by limiting the current flowing through the discharge transistor 630. The resistance value of the discharge resistor 636 may be selected to mitigate rises in the discharge transistor 630 gate voltage during an ESD event, and to prevent premature discharge of the intermediate node.

The illustrated ESD-protected circuits 500, 600 include accurate trigger circuits 518, 618 that can track process corners representing limits of PVT variation. The trigger circuits 518, 618 produce trigger signals 516, 616 that can follow surge voltages closely during an ESD event. This ability to match time constants of ESD surges allows the trigger circuits 518, 618 to scale and to protect against overvoltages in many different types of ESD events. The capacitor divider circuits 526, 626 provide a voltage divider that can be configured to limit voltage levels of the trigger signals 516, 616 to rated values for any expected ESD event. The discharge transistors 530, 630 in the trigger circuits 518, 618 ensure that the intermediate voltage of the capacitor divider circuit 626, which may be measured at the common nodes 540, 640, is discharged during normal operation such that the M1 transistors 508, 608 do not interfere with the mission or intended operation of the respective ESD-protected circuits 500, 600. The trigger circuits 518, 618 occupy a small area in comparison to conventional RC-based trigger circuits. For example, a conventional RC-based trigger circuit can be expected to occupy an area of approximately 1200 $\mu m^2$ of an IC device when configured for use with an ESD surge voltage that has a 1 µs time constant, and approximately 7000 $\mu m^2$ of an IC device when configured for use with an ESD surge voltage that has a 10 µs time constant. The RC-based trigger circuits may require larger areas in an IC device when other circuits are needed to ensure reliability of the RC-based trigger circuits. A trigger circuit 518 or 618 configured in accordance with certain aspects of this disclosure can be provided in an area that is less than 400 $\mu m^2$ irrespective of the time constant of ESD surge voltages.

In certain implementations, a trigger circuit configured in accordance with certain aspects of this disclosure has a first capacitor and a second capacitor connected in series and a control device. The first capacitor is connected to a first voltage rail and to a common node, and the second capacitor is connected to a second voltage rail and to the common node. The control device has a first terminal that is coupled to the common node and a control terminal to receive a control signal. The control signal may be decoupled from transients on the first voltage rail and the second voltage rail. An output of the trigger circuit is coupled to the common node.

In certain examples, the control signal is coupled to a reference voltage configured to turn on the control device when magnitudes of voltages of the first voltage rail and the second voltage rail are at respective nominal values. The control device may include a control transistor, such as the discharge transistor 530 or 630. The trigger output may have a voltage determined by a source-drain voltage of the control transistor when the control transistor is turned on.

In certain examples, the control signal is coupled to a reference voltage configured to turn off the control device when magnitude of voltage of the first voltage rail or the second voltage rail exceeds a threshold minimum voltage. In one example, the threshold minimum voltage is exceeded during an ESD event.

In one example, the trigger output has a voltage related to a ratio of capacitance values of the first capacitor and the second capacitor during an ESD event. In one example, the control terminal of the control device is coupled to the control signal through a resistance-capacitance circuit.

In one example, the control device is an nMOS transistor. A source of the nMOS transistor may be coupled through a resistance to the first voltage rail or the second voltage rail. In certain examples, the apparatus is implemented using an IC device. The trigger output may be coupled to a transistor in an output circuit of the IC device. The trigger output may be coupled to a transistor that drives an output circuit of the integrated circuit device.

Figure 7:
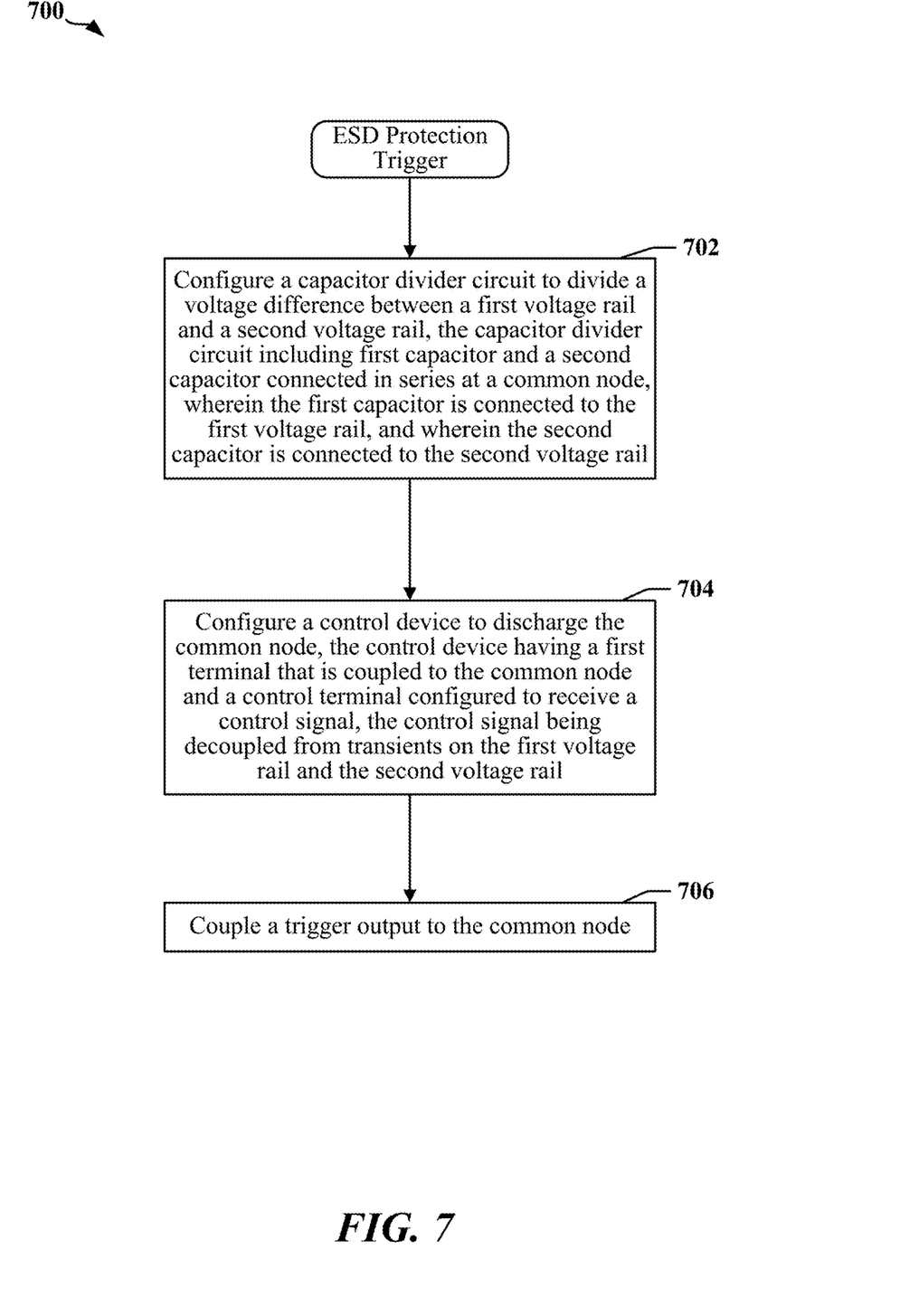
FIG. 7 is a flow diagram illustrating an example of a method for triggering an ESD protection circuit in accordance with certain aspects disclosed herein.

FIG. 7 is a flow diagram illustrating an example of a method 700 for triggering an electrostatic discharge protection circuit in accordance with certain aspects disclosed herein. The method may relate to various features and aspects of the ESD protection circuit illustrated in FIGS. 5 and 6. At block 702, a capacitor divider circuit may be configured to divide a voltage difference between a first voltage rail and a second voltage rail. The first voltage rail may correspond to the first voltage rail 510 or 610 shown in FIGS. 5 and 6 and the second voltage rail may correspond to the second voltage rail 512 or 612 shown in FIGS. 5 and 6. The capacitor divider circuit may include a first capacitor and a second capacitor connected in series at a common node. The first capacitor may be connected to the first voltage rail, and the second capacitor may be connected to the second voltage rail.

At block 704, a control device may be configured to discharge the common node. In some examples, the control device corresponds to the discharge transistor 530 or 630 shown in FIGS. 5 and 6. The control device has a first terminal that is coupled to the common node and a control terminal configured to receive a control signal. The control signal may be decoupled from transients on the first voltage rail and the second voltage rail. At block 706, a trigger output is coupled to the common node.

In certain examples, the control signal is coupled to a reference voltage configured to turn on the control device when magnitudes of voltages of the first voltage rail and the second voltage rail are at respective nominal values. The control device may include a control transistor, such as the discharge transistor 530 or 630. The trigger output may have a voltage determined by a source-drain voltage of the control transistor when the control transistor is turned on.

In certain examples, the control signal is coupled to a reference voltage configured to turn off the control device when magnitude of voltage of the first voltage rail or the second voltage rail exceeds a threshold minimum voltage. In one example, the threshold minimum voltage is exceeded during an ESD event.

In one example, the trigger output has a voltage related to a ratio of capacitance values of the first capacitor and the second capacitor during an ESD event. In one example, the control terminal of the control device is coupled to the control signal through a resistance-capacitance circuit.

In one example, the control device is an nMOS transistor. A source of the nMOS transistor may be coupled through a resistance to the first voltage rail or the second voltage rail. In certain examples, the apparatus is implemented using an IC device. The trigger output may be coupled to a transistor in an output circuit of the IC device. The trigger output may be coupled to a transistor that drives an output circuit of the integrated circuit device.

It is noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus performing certain functions disclosed herein may include means for dividing a voltage difference between a first voltage rail and a second voltage rail. The means for dividing the voltage difference may include a first capacitor and a second capacitor connected in series at a common node. The first capacitor may be connected to the first voltage rail, and the second capacitor may be connected to the second voltage rail. The apparatus may include means for selectively discharging the common node, including a control device having a first terminal that is coupled to the common node and a control terminal configured to receive a control signal. The control signal may be decoupled from transients on the first voltage rail and the second voltage rail. A trigger output may be coupled to the common node.

In certain examples, the control signal is coupled to a reference voltage configured to turn on the control device when magnitudes of voltages of the first voltage rail and the second voltage rail are at respective nominal values. The control device may include a control transistor, such as the discharge transistor 530 or 630. The trigger output may have a voltage determined by a source-drain voltage of the control transistor when the control transistor is turned on. In certain examples, the control signal is coupled to a reference voltage configured to turn off the control device when magnitude of voltage of the first voltage rail or the second voltage rail exceeds a threshold minimum voltage. In one example, the threshold minimum voltage is exceeded during an ESD event.

In one example, the trigger output has a voltage related to a ratio of capacitance values of the first capacitor and the second capacitor during an ESD event. In one example, control terminal of the control device is coupled to the control signal through a resistance-capacitance circuit.

In one example, the control device is an nMOS transistor. A source of the nMOS transistor may be coupled through a resistance to the first voltage rail or the second voltage rail. In certain examples, the apparatus is implemented using an IC device. The trigger output may be coupled to a transistor in an output circuit of the IC device. The trigger output may be coupled to a transistor that drives an output circuit of the integrated circuit device.

Some implementation examples are described in the following numbered clauses:

1. A trigger circuit, comprising: a first capacitor and a second capacitor connected in series, wherein the first capacitor is connected to a first voltage rail and to a common node, and wherein the second capacitor is connected to a second voltage rail and to the common node; a control device having a first terminal that is coupled to the common node and a control terminal to receive a control signal, the control signal being decoupled from transients on the first voltage rail and the second voltage rail; and an output of the trigger circuit coupled to the common node.
2. The trigger circuit as described in clause 1, wherein the control signal is coupled to a reference voltage configured to turn on the control device when magnitudes of voltages of the first voltage rail and the second voltage rail are at respective nominal values.
3. The trigger circuit as described in clause 2, wherein the control device comprises a control transistor, and the output of the trigger circuit has a voltage determined by a source-drain voltage of the control transistor when the control transistor is turned on.
4. The trigger circuit as described in any of clauses 1-3, wherein the control signal is coupled to a reference voltage configured to turn off the control device when magnitude of voltage of the first voltage rail or the second voltage rail exceeds a threshold minimum voltage.
5. The trigger circuit as described in clause 4, wherein the threshold minimum voltage is exceeded during an electrostatic discharge (ESD) event.
6. The trigger circuit as described in any of clauses 1-5, wherein the output of the trigger circuit has a voltage related to a ratio of capacitance values of the first capacitor and the second capacitor during an ESD event.
7. The trigger circuit as described in any of clauses 1-6, wherein the control terminal of the control device is coupled to the control signal through a resistance-capacitance circuit.
8. The trigger circuit as described in any of clauses 1-7, wherein the control device comprises an n-type metal oxide semiconductor (nMOS) transistor, a source of the nMOS transistor is coupled through a resistance to the first voltage rail or the second voltage rail.
9. The trigger circuit as described in any of clauses 1-8, wherein the trigger circuit is provided in an integrated circuit device and wherein the output of the trigger circuit is coupled to a transistor in an output circuit of the integrated circuit device.
10. The trigger circuit as described in any of clauses 1-9, wherein the trigger circuit is provided in an integrated circuit device and wherein the output of the trigger circuit is coupled to a transistor that drives an output circuit of the integrated circuit device.
11. An apparatus, comprising: means for driving an input/output pad of an integrated circuit device; means for dividing a voltage difference between a first voltage rail and a second voltage rail, the means for dividing the voltage difference including a first capacitor and a second capacitor connected in series at a common node, wherein the first capacitor is connected to the first voltage rail, and wherein the second capacitor is connected to the second voltage rail; means for selectively discharging the common node, including a control device having a first terminal that is coupled to the common node and a control terminal configured to receive a control signal, the control signal being decoupled from transients on the first voltage rail and the second voltage rail; and a trigger output coupled to the common node.

12. The apparatus as described in clause 11, wherein the control signal is coupled to a reference voltage configured to turn on the control device when magnitudes of voltages of the first voltage rail and the second voltage rail are at respective nominal values.

13. The apparatus as described in clause 12, wherein the control device comprises a control transistor, and the trigger output has a voltage determined by a source-drain voltage of the control transistor when the control transistor is turned on.

14. The apparatus as described in any of clauses 11-13, wherein the control signal is coupled to a reference voltage configured to turn off the control device when magnitude of voltage of the first voltage rail or the second voltage rail exceeds a threshold minimum voltage.

15. The apparatus as described in clause 14, wherein the threshold minimum voltage is exceeded during an electrostatic discharge (ESD) event.

16. The apparatus as described in any of clauses 11-15, wherein the trigger output has a voltage related to a ratio of capacitance values of the first capacitor and the second capacitor during an ESD event.

17. The apparatus as described in in any of clauses 11-16, wherein the control terminal of the control device is coupled to the control signal through a resistance-capacitance circuit.

18. The apparatus as described in any of clauses 15-17, wherein the control device comprises an n-type metal oxide semiconductor (nMOS) transistor, a source of the nMOS transistor is coupled through a resistance to the first voltage rail or the second voltage rail.

19. The apparatus as described in any of clauses 15-18, wherein the apparatus comprises an integrated circuit device and wherein the trigger output is coupled to a transistor in an output circuit of the integrated circuit device.

20. The apparatus as described in any of clauses 15-19, wherein the apparatus comprises an integrated circuit device and wherein the trigger output is coupled to a transistor that drives an output circuit of the integrated circuit device.

21. A method for triggering an electrostatic discharge protection circuit, comprising: configuring a capacitor divider circuit to divide a voltage difference between a first voltage rail and a second voltage rail, the capacitor divider circuit including a first capacitor and a second capacitor connected in series at a common node, wherein the first capacitor is connected to the first voltage rail, and wherein the second capacitor is connected to the second voltage rail; configuring a control device to discharge the common node, the control device having a first terminal that is coupled to the common node and a control terminal configured to receive a control signal, the control signal being decoupled from transients on the first voltage rail and the second voltage rail; and coupling a trigger output to the common node.

22. The method as described in clause 21, wherein the control signal is coupled to a reference voltage configured to turn on the control device when magnitudes of voltages of the first voltage rail and the second voltage rail are at respective nominal values.

23. The method as described in clause 22, wherein the control device comprises a control transistor, and the trigger output has a voltage determined by a source-drain voltage of the control transistor when the control transistor is turned on.

24. The method as described in any of clauses 21-23, wherein the control signal is coupled to a reference voltage configured to turn off the control device when magnitude of voltage of the first voltage rail or the second voltage rail exceeds a threshold minimum voltage.

25. The method as described in clause 24, wherein the threshold minimum voltage is exceeded during an electrostatic discharge (ESD) event.

26. The method as described in any of clauses 21-25, wherein the trigger output has a voltage related to a ratio of capacitance values of the first capacitor and the second capacitor during an ESD event.

27. The method as described in any of clauses 21-26, wherein the control terminal of the control device is coupled to the control signal through a resistance-capacitance circuit.

28. The method as described in any of clauses 21-27, wherein the control device comprises an n-type metal oxide semiconductor (nMOS) transistor, a source of the nMOS transistor is coupled through a resistance to the first voltage rail or the second voltage rail.

29. The method as described in any of clauses 21-28, wherein the apparatus comprises an integrated circuit device and wherein the trigger output is coupled to a transistor in an output circuit of the integrated circuit device.

30. The method as described in any of clauses 21-29, wherein the apparatus comprises an integrated circuit device and wherein the trigger output is coupled to a transistor that drives an output circuit of the integrated circuit device.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:
1. A trigger circuit, comprising:
   a first capacitor and a second capacitor connected in series, wherein the first capacitor is connected to a first voltage rail and to a common node, and wherein the second capacitor is connected to a second voltage rail and to the common node;
   a control device having a first terminal that is coupled to the common node and a control terminal to receive a control signal, the control signal being decoupled from transients on the first voltage rail and the second voltage rail; and an output of the trigger circuit coupled to the common node, wherein (i) the control terminal of the control device is coupled to the control signal through a resistance-capacitance circuit, or (ii) the control device comprises an n-type metal oxide semiconductor (nMOS) transistor that has a source coupled through a resistance to the first voltage rail or the second voltage rail.

2. The trigger circuit of claim 1, wherein the control signal is coupled to a reference voltage configured to turn on the control device when magnitudes of voltages of the first voltage rail and the second voltage rail are at respective nominal values.

3. The trigger circuit of claim 2, wherein the control device comprises a control transistor, and the output of the trigger circuit has a voltage determined by a source-drain voltage of the control transistor when the control transistor is turned on.

4. The trigger circuit of claim 1, wherein the control signal is coupled to a reference voltage configured to turn off the control device when magnitude of voltage of the first voltage rail or the second voltage rail exceeds a threshold minimum voltage.

5. The trigger circuit of claim 4, wherein the threshold minimum voltage is exceeded during an electrostatic discharge (ESD) event.

6. The trigger circuit of claim 1, wherein the output of the trigger circuit has a voltage related to a ratio of capacitance values of the first capacitor and the second capacitor during an ESD event.

7. The trigger circuit of claim 1, wherein the trigger circuit is provided in an integrated circuit device and wherein the output of the trigger circuit is coupled to a transistor in an output circuit of the integrated circuit device.

8. The trigger circuit of claim 1, wherein the trigger circuit is provided in an integrated circuit device and wherein the output of the trigger circuit is coupled to a transistor that drives an output circuit of the integrated circuit device.

9. An apparatus, comprising:
means for dividing a voltage difference between a first voltage rail and a second voltage rail, the means for dividing the voltage difference including a first capacitor and a second capacitor connected in series at a common node, wherein the first capacitor is connected to the first voltage rail, and wherein the second capacitor is connected to the second voltage rail;
means for selectively discharging the common node, including a control device having a first terminal that is coupled to the common node and a control terminal configured to receive a control signal, the control signal being decoupled from transients on the first voltage rail and the second voltage rail; and
a trigger output coupled to the common node,
wherein (i) the control terminal of the control device is coupled to the control signal through a resistance-capacitance circuit, or (ii) the control device comprises an n-type metal oxide semiconductor (nMOS) transistor that has a source coupled through a resistance to the first voltage rail or the second voltage rail.

10. The apparatus of claim 9, wherein the control signal is coupled to a reference voltage configured to turn on the control device when magnitudes of voltages of the first voltage rail and the second voltage rail are at respective nominal values.

11. The apparatus of claim 10, wherein the control device comprises a control transistor, and the trigger output has a voltage determined by a source-drain voltage of the control transistor when the control transistor is turned on.

12. The apparatus of claim 9, wherein the control signal is coupled to a reference voltage configured to turn off the control device when magnitude of voltage of the first voltage rail or the second voltage rail exceeds a threshold minimum voltage.

13. The apparatus of claim 12, wherein the threshold minimum voltage is exceeded during an electrostatic discharge (ESD) event.

14. The apparatus of claim 9, wherein the trigger output has a voltage related to a ratio of capacitance values of the first capacitor and the second capacitor during an ESD event.

15. The apparatus of claim 9, wherein the apparatus comprises an integrated circuit device and wherein the trigger output is coupled to a transistor in an output circuit of the integrated circuit device.

16. The apparatus of claim 9, wherein the apparatus comprises an integrated circuit device and wherein the trigger output is coupled to a transistor that drives an output circuit of the integrated circuit device.

17. A method for triggering an electrostatic discharge protection circuit, comprising:
configuring a capacitor divider circuit to divide a voltage difference between a first voltage rail and a second voltage rail, the capacitor divider circuit including a first capacitor and a second capacitor connected in series at a common node, wherein the first capacitor is connected to the first voltage rail, and wherein the second capacitor is connected to the second voltage rail;
configuring a control device to discharge the common node, the control device having a first terminal that is coupled to the common node and a control terminal configured to receive a control signal, the control signal being decoupled from transients on the first voltage rail and the second voltage rail; and
coupling a trigger output to the common node,
wherein (i) the control terminal of the control device is coupled to the control signal through a resistance-capacitance circuit, or (ii) the control device comprises an n-type metal oxide semiconductor (nMOS) transistor that has a source coupled through a resistance to the first voltage rail or the second voltage rail.

18. The method of claim 17, wherein the control signal is coupled to a reference voltage configured to turn on the control device when magnitudes of voltages of the first voltage rail and the second voltage rail are at respective nominal values.

19. The method of claim 18, wherein the control device comprises a control transistor, and the trigger output has a voltage determined by a source-drain voltage of the control transistor when the control transistor is turned on.

20. The method of claim 17, wherein the control signal is coupled to a reference voltage configured to turn off the control device when magnitude of voltage of the first voltage rail or the second voltage rail exceeds a threshold minimum voltage.

21. The method of claim 20, wherein the threshold minimum voltage is exceeded during an electrostatic discharge (ESD) event.

22. The method of claim 17, wherein the trigger output has a voltage related to a ratio of capacitance values of the first capacitor and the second capacitor during an ESD event.

23. The method of claim 17, wherein the electrostatic discharge protection circuit is included in an integrated circuit device and wherein the trigger output is coupled to a transistor in an output circuit of the integrated circuit device.

24. The method of claim 17, wherein the electrostatic discharge protection circuit is included in an integrated circuit device and wherein the trigger output is coupled to a transistor that drives an output circuit of the integrated circuit device.

\* \* \* \* \*